United States Patent
Shimizu et al.

[11] Patent Number: 5,171,941
[45] Date of Patent: Dec. 15, 1992

[54] SUPERCONDUCTING STRAND FOR ALTERNATING CURRENT

[75] Inventors: Hitoshi Shimizu; Katsuro Oishi, both of Yokohama; Masaru Ikeda, Tokyo; Yasuzo Tanaka, Yokohama; Shirabe Akita, Tokyo; Osami Tsukamoto, Yokohama, all of Japan

[73] Assignees: The Furukawa Electric Co., Ltd.; Central Research Institute of Electric Power Industry, both of Tokyo, Japan

[21] Appl. No.: 668,878

[22] Filed: Mar. 13, 1991

[30] Foreign Application Priority Data

Mar. 30, 1990 [JP] Japan .................................. 2-80680
Mar. 30, 1990 [JP] Japan .................................. 2-80681

[51] Int. Cl.$^5$ .......................................... H01B 12/00
[52] U.S. Cl. ............................. 174/125.1; 174/128.1; 174/130; 174/131 R
[58] Field of Search ............... 174/125.1, 128.1, 130, 174/131 R, 131 A

[56] References Cited

U.S. PATENT DOCUMENTS

| | | | |
|---|---|---|---|
| 3,618,205 | 11/1971 | Barber et al. | 174/125.1 X |
| 3,657,466 | 4/1972 | Woolcock et al. | 174/125.1 X |
| 3,699,647 | 10/1972 | Bidault et al. | 174/DIG. 6 X |
| 3,963,425 | 6/1976 | Sambrook | 174/125.1 X |
| 4,169,964 | 10/1979 | Horvath et al. | 174/125.1 X |
| 4,501,062 | 2/1985 | Hillmann et al. | 174/125.1 X |
| 4,652,697 | 3/1987 | Ando et al. | 174/125.1 |
| 4,723,355 | 2/1988 | Both et al. | 174/125.1 X |
| 4,743,713 | 5/1988 | Scanlan | 174/125.1 |
| 4,857,675 | 8/1989 | Marancik et al. | 174/125.1 |

FOREIGN PATENT DOCUMENTS

| | | |
|---|---|---|
| 1-251517 | 10/1989 | Japan . |
| 2-213009 | 8/1990 | Japan . |
| 1455333 | 11/1976 | United Kingdom ............. 174/125.1 |

*Primary Examiner*—Morris H. Nimmo
*Attorney, Agent, or Firm*—Frishauf, Holtz, Goodman & Woodward

[57] ABSTRACT

There is provided a superconducting strand for alternating current which is formed by stranding 13 or more superconducting wires having a diameter smaller than that of a non-magnetic core member in a single-layered form on the outer peripheral surface of the core member and which can efficiently remove heat caused by AC loss, avoid a quenching phenomenon and stably maintain the superconducting state. Preferably, an electrically insulataive braided layer formed of polyester fiber is interposed between the core member and the stranded superconducting wires and stable insulation can be maintained therebetween, thereby preventing flow of coupling current caused by defective insulation and suppressing partial heat generation. The superconducting wire contains a large number of NbTi superconducting filaments and a non-magnetic stainless steel wire can be preferably used for the core member.

11 Claims, 3 Drawing Sheets

SUPERCONDUCTING STRAND FOR ALTERNATING CURRENT

BACKGROUND OF THE INVENTION

1. Field of the Invention

This invention relates to a superconducting strand used in a transformer and the like, for permitting an AC current to flow therein.

2. Description of the Related Art

A superconducting wire for alternating current has the diameter reduced and the diameter of the wire is generally set at approx. 0.1 mm. However, if the diameter of the wire is small, the current capacity thereof becomes small, and therefore, when the superconducting wire is used for a superconducting coil, a preset number of superconducting wires are stranded together to constitute a superconducting strand.

As shown in FIG. 1, the conventional superconducting strand generally has a structure in which strands of stranded wires are stranded together, for example, six primary strands 2 each of which is constructed by stranding seven superconducting wires 1 together are stranded on the outer surface of a non-magnetic core member 3 which comprises stainless steel wires or the like. In general, the primary strand 2 is formed of 3, 7 or 19 superconducting wires of the same diameter for easy stranding.

Since heat generation due to AC loss occurs in the superconducting wire in which an AC current flows, it is necessary to sufficiently cool the superconducting wire. However, since the conventional AC superconducting strand has a structure in which strands formed of standard wires are stranded, heat removal efficiency of the superconducting wires disposed in the inner portion of the superconducting strand is lower than that of the superconducting wires disposed in the outer portion of the superconducting strand and therefore the temperature thereof tends to become high, causing a quenching phenomenon. In particular, when the superconducting strand is impregnated with epoxy resin for insulation, the above tendency becomes significant.

Further, since the conventional superconducting strand is constructed by stranding a plurality of primary strands each of which is formed of a preset number of stranded superconducting wires, the number of superconducting wires used cannot be continuously changed and it is sometimes impossible to meet the requirement for the strand of a desired current capacity.

Further, in this type of conventional superconducting strand, insulation films for the superconducting wires and core member are formed by baking insulative varnish thereon and the insulation films are generally formed to a thickness of approx. 10 μm. However, with the conventional insulation films, defective insulation tends to occur between the wires because of formation of pinholes, irregularity in baking and damages given to the wires in the stranding or winding processes, and if the defective insulation has occurred and when an AC current is caused to flow in the superconducting strand, an abnormal coupling current flows between the superconducting wires, or between the superconducting wire 1 and the stainless steel wire 3 due to the difference in inductance, causing partial heat generation to break the superconducting state.

SUMMARY OF THE INVENTION

A first object of this invention is to provide a superconducting strand for alternating current capable of efficiently removing heat caused by AC loss, making it difficult to cause a quenching phenomenon and stably maintaining the superconducting state.

Another object of this invention is to provide a superconducting strand for alternating current capable of stably maintaining insulation between the core member and the superconducting wire to prevent flow of coupling current caused by defective insulation and suppress partial heat generation even when some pinholes are formed in the insulation film of the superconducting wire or irregularity in baking occurs therein.

Still another object of this invention is to provide a superconducting strand for alternating current in which the number of superconducting wires can be freely selected so as to provide a desired current capacity.

A superconducting strand for alternating current of this invention comprises a non-magnetic core member; and not less than 13 superconducting wires which have a diameter smaller than the core member preferably formed of stainless steel wire or titanium wire, and are stranded in a single-layered form on the outer peripheral surface of the core member.

Preferably, an electrically insulative braided layer formed of polyester fiber is interposed between the core member and the stranded superconducting wires to stably maintain insulation between the core member and the superconducting wires.

The superconducting wire is formed of a large number of NbTi superconducting filaments.

DETAILED DESCRIPTION OF THE PREFERRED EMBODIMENTS

Figure 2:
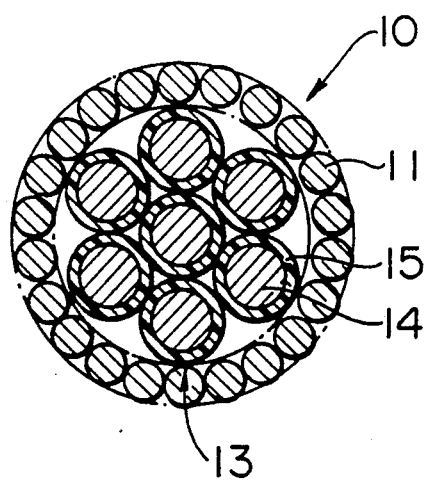
FIG. 2 is a cross sectional view showing the structure of a superconducting strand for alternating current according to one embodiment of this invention.

FIG. 2 shows a first embodiment of a superconducting strand for alternating current according to this invention. An AC superconducting strand 10 is constructed by stranding a preset number of superconducting wires 11, for example, twenty-two (22) superconducting wires on the outer peripheral surface of a core member 13 in a single-layered form. Since the superconducting wires 11 are stranded together in a single-layered form, the number of stranded superconducting wires 11 can be freely set to a desired number equal to or larger than 13 by properly adjusting the outer diameter of the core member 13, and therefore, a desired current capacity can be attained.

The core member 13 is formed as a strand having an outer diameter of 0.855 mm by stranding seven (7) stainless steel wires 14 with an outer diameter of 0.265 mm each having a polyester film 15 with a film thickness of 10 $\mu$m formed thereon. The core member 13 is required to be non-magnetic and have high electrical resistance and high rigidity, and a non-magnetic stainless steel wire or titanium wire may be preferably used as the core member. Further, the core member 13 may be a strand as described above or may be a single round wire. Each of the superconducting wires 11 has a polyester film with a thickness of 10 $\mu$m formed thereon and the diameter of the wire is 0.14 mm.

Figure 3:
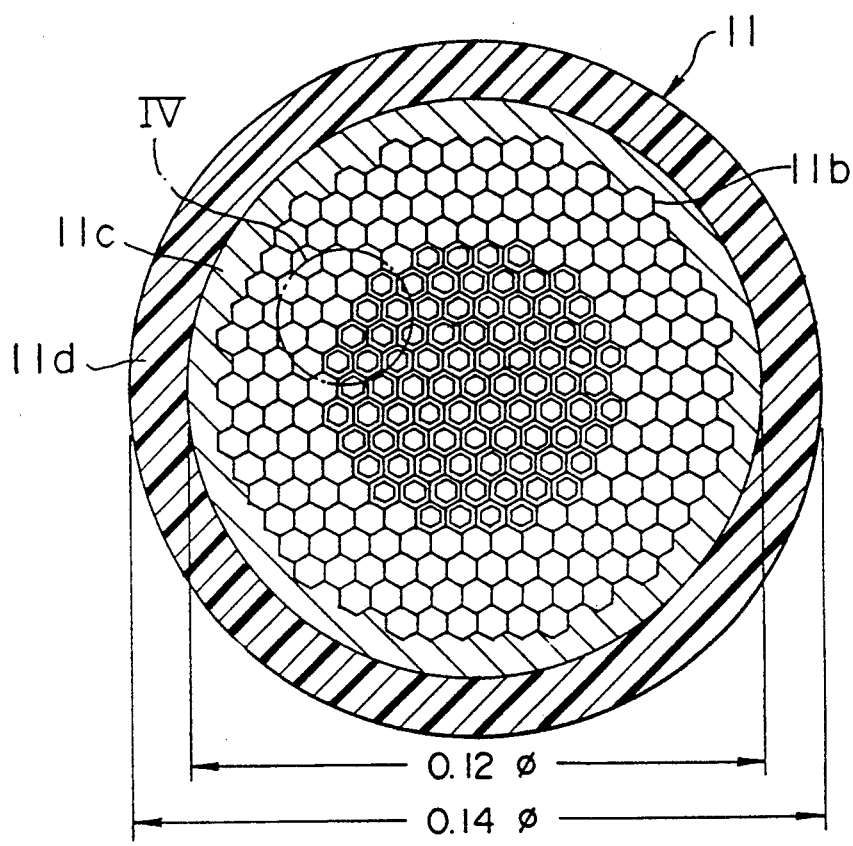
FIG. 3 is a cross sectional view showing the structure of one of the superconducting wires of the superconducting strand shown in FIG. 2.
Figure 4:
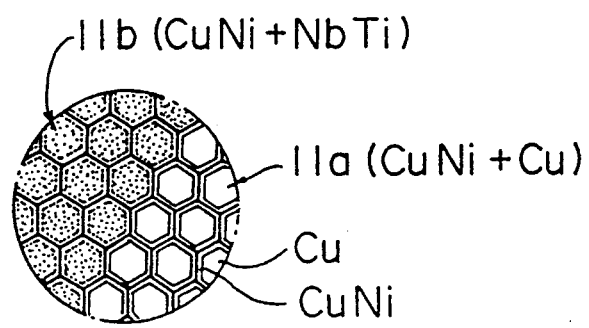
FIG. 4 is an enlarged cross sectional view showing a portion defined by a circle IV in FIG. 3.

FIGS. 3 and 4 show the structure of the superconducting wire 11. In order to manufacture the superconducting wire 11, CuNi-Cu wires 11a and CuNi-NbTi wires 11b are first prepared. The CuNi-Cu wire 11a is formed by inserting an ingot of oxygen free copper into a CuNi tube containing Ni of 10 weight % and Cu as the remaining portion thereof and working the same into a wire having a hexagonal cross section by effecting the extruding and wire drawing operations. The CuNi-NbTi wire 11b is formed by first inserting ingots of NbTi containing Nb of 50 weight % and Ti of 50 weight % into the above-described type CuNi tubes and working the same into primary wires having a hexagonal cross section by effecting the extruding and wire drawing operations and then inserting eighty-five (85) primary wires into a CuNi tube and working the same into a wire having a hexagonal cross section by effecting the extruding and wire drawing operations.

Then, eighty-five (85) CuNi-Cu wires 11a are bundled in the central portion, one hundred and sixty-eight (168) CuNi-NbTi wires 11b are disposed on the outer peripheral surface thereof, the wire assembly thus obtained is inserted into the CuNi tube 11c, the outer diameter thereof is reduced to 0.12 mm by effecting the extruding and wire drawing operations, and the outer surface thereof is coated with a polyester film 11d to form a superconducting wire 11 having a final outer diameter of 0.14 mm. The superconducting wire 11 thus obtained has approx. 15,500 superconducting filaments and the average equivalent diameter of NbTi is 0.5 $\mu$m. The cross-sectional area ratio Cu:CuNi:NbTi of the wire 11 is 0.2:2.5:1.0.

Figure 1:
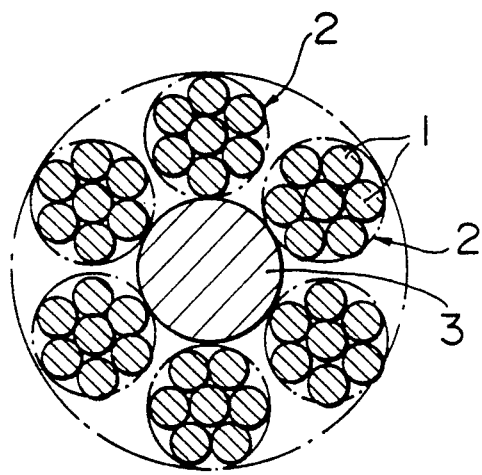
FIG. 1 is a cross sectional view showing the structure of the conventional superconducting strand.

Since, in the AC superconducting strand 10 with the above construction, the superconducting wires 11 are all disposed on the outer peripheral surface of the core member 13, the wires 11 can be uniformly and efficiently cooled when the superconducting strand is cooled by use of cooling medium such as liquid helium, and an AC quenching current value can be raised in comparison with the conventional superconducting strand shown in FIG. 1.

Figure 5:
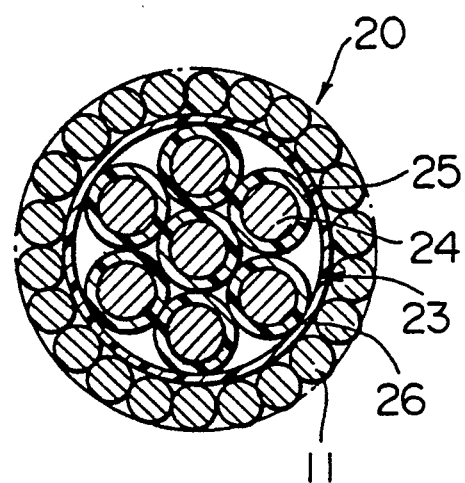
FIG. 5 is a cross sectional view showing the structure of a superconducting strand for alternating current according to another embodiment of this invention.

FIG. 5 shows an AC superconducting strand 20 according to another embodiment of this invention and the strand 20 has a braided layer 26 with a thickness of 60 $\mu$m as an electrically insulative layer interposed between the core member 13 of the superconducting strand 10 shown in FIG. 2 and the superconducting wires 11 disposed on the outer peripheral surface of the core member 13. Polyester fiber, glass fiber, and the like are preferably used as the material of the braided layer 26. The core member 23 of the strand 20 is formed by stranding together seven (7) stainless steel wires 24 which have a diameter of 0.175 mm and each of which is coated with a polyester insulation film 25 with a thickness of 10 $\mu$m. The superconducting wires 11 stranded in a single-layered form on the outer peripheral surface of the braided layer 26 are the same as those used in the superconducting strand 10 of FIG. 2. The outer diameter of the strand 20 of this embodiment is 0.985 mm.

Figure 5A:
FIG. 5A shows a modified superconducting wire for use in the embodiment of FIG. 5.

As shown in FIG. 5A (which is not drawn to scale), it is also possible to further dispose a polyester fiber braided layer 28 with a thickness of 60 $\mu$m on the outer peripheral surface of the superconducting wire 11 in the embodiment shown in FIG. 5, and in this case, the total outer diameter becomes approx. 1.105 mm.

As described above, when the braided layer is disposed as an electrically insulative layer between the core member and the superconducting wires, the braided layer acts as a buffer member and the superconducting strand maintains the flexibility, thereby preventing the insulative film of the superconducting wire from being damaged by friction between the core member and the superconducting wires during stranding and wiring operations. Further, even if pinholes are formed or irregularity in baking has occurred in the insulative film of the superconducting wire, insulation between the core member and the superconducting wire can be maintained, and as a result, stable insulation can be attained between the core member and the superconducting wire having different inductances, thereby preventing an abnormal coupling current from flowing between the core member and the superconducting wire and making it possible to maintain the stable superconducting state. Further, presence of the braided layer permits epoxy resin or the like to be easily impregnated.

Figure 6:
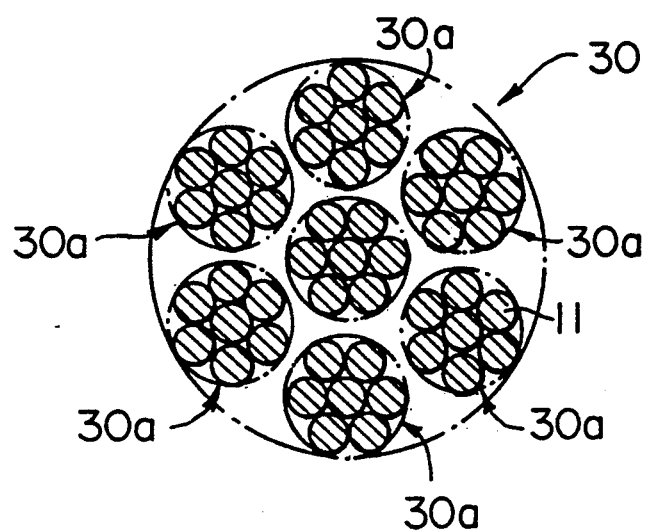
FIG. 6 is a cross sectional view showing the structure of a 7×7 secondary strand which is formed so that the performance thereof can be compared with that of a superconducting strand for alternating current according to this invention.

The effect obtained by stranding the superconducting wires 11 in a single-layered form was experimentally confirmed by use of the AC superconducting strand 20 of this invention shown in FIG. 5 and the AC superconducting strand 30 of FIG. 6 formed for comparison. The AC superconducting strand 30 of FIG. 6 is constructed by forming seven (7) primary strands 30a each of which is formed by stranding seven (7) superconducting wires 11 and then stranding the seven (7) primary strands 30a into a 7×7 stranded cable. In the experiment, superconducting magnets were formed by winding the superconducting strands 20 and 30 as samples on respective FRP bobbins in a non-inductive manner and impregnating epoxy resin into them. AC quenching currents were measured with the bobbins placed in an external AC magnetic field. As a result, the ratios of actual AC quenching currents of the superconducting strands 20 and 30 to a DC critical current of the superconducting strand derived from the DC critical current of the superconducting wire were 62% and 44%, respectively, and thus the effect of the single-layered strand could be proved.

What is claimed is:

1. A superconducting strand for alternating current, comprising:

a non-magnetic core member;

superconducting wires of a number not less than 13, each superconducting wire having a diameter smaller than that of said core member and said superconducting wires being stranded on the outer peripheral surface of said core member in a single-layered form; and electrically insulative layer means interposed between said core member and said stranded superconducting wires.

2. A superconducting strand for alternating current according to claim 1, wherein said core member is formed of a non-magnetic stainless steel wire.

3. A superconducting strand for alternating current according to claim 1, wherein said core member is formed of a titanium wire.

4. A superconducting strand for alternating current according to claim 1, wherein said core member comprises a strand formed by stranding a plurality of non-magnetic wires.

5. A superconducting strand for alternating current according to claim 1, wherein said core member comprises a singal round wire.

6. A superconducting strand for alternating current according to claim 1, wherein said superconducting wire includes a plurality of NbTi superconducting filaments.

7. A superconducting strand for alternating current according to claim 1, wherein said electrically insulative layer means comprises a braided layer surrounding said core member.

8. A superconducting strand for alternating current according to claim 7, wherein said braided layer is formed of polyester fiber.

9. A superconducting strand for alternating current according to claim 7, wherein said braided layer is formed of glass fiber.

10. A superconducting strand for alternating current according to claim 4, wherein said electrically insulative layer means comprises film layers formed on each wire of said core member.

11. A superconducting strand for alternating current according to claim 10, wherein each of said film layers is formed of polyester film.

* * * * *